US 8,084,694 B2

(12) United States Patent
Stegmaier et al.

(10) Patent No.: US 8,084,694 B2
(45) Date of Patent: Dec. 27, 2011

(54) ELECTRICAL CONTACT DEVICE

(75) Inventors: Juergen Stegmaier, Schwaebisch Gmuend (DE); Markus Ledermann, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 306 days.

(21) Appl. No.: 11/988,486

(22) PCT Filed: Jul. 25, 2006

(86) PCT No.: PCT/EP2006/064619
§ 371 (c)(1),
(2), (4) Date: Feb. 27, 2009

(87) PCT Pub. No.: WO2007/012639
PCT Pub. Date: Feb. 1, 2007

(65) Prior Publication Data
US 2009/0205861 A1    Aug. 20, 2009

(30) Foreign Application Priority Data
Jul. 27, 2005   (DE) .................. 10 2005 035 061

(51) Int. Cl.
*H05K 1/11* (2006.01)
(52) U.S. Cl. .......... 174/261; 174/263; 174/267; 73/715; 73/727; 73/754; 257/623; 257/626; 257/715; 324/207.2
(58) Field of Classification Search ............. 174/261, 174/263, 267; 73/715, 727, 754; 257/623, 257/626, 715; 324/207.2
See application file for complete search history.

(56) References Cited

U.S. PATENT DOCUMENTS

| | | | |
|---|---|---|---|
| 5,144,843 A * | 9/1992 | Tamura et al. .................. 73/727 |
| 6,212,946 B1 * | 4/2001 | Naegele et al. ............ 73/114.31 |
| 2003/0085469 A1 * | 5/2003 | Yamada et al. ............... 257/773 |
| 2004/0085062 A1 * | 5/2004 | Miyata et al. ............. 324/207.2 |
| 2005/0103111 A1 * | 5/2005 | Imai et al. ........................ 73/715 |
| 2006/0001143 A1 * | 1/2006 | Boon et al. ..................... 257/686 |
| 2008/0148861 A1 * | 6/2008 | Beer ............................... 73/754 |

FOREIGN PATENT DOCUMENTS

| | | |
|---|---|---|
| DE | 19711939 | 9/1998 |
| EP | 1118849 | 7/2001 |
| EP | 1118849 A1 * | 7/2001 |
| JP | 2005147795 A * | 6/2005 |
| JP | 2005192311 | 7/2005 |
| JP | 2005192311 A * | 7/2005 |

OTHER PUBLICATIONS

International Search Report, PCT International Patent Application No. PCT/EP2006/064619 dated Dec. 6, 2006.

* cited by examiner

*Primary Examiner* — Xiaoliang Chen
(74) *Attorney, Agent, or Firm* — Kenyon & Kenyon LLP

(57) ABSTRACT

An electrical contact device comprising a first contact assemblage having multiple contact pads disposed in a row which are allocated to different connection types, and having a second contact assemblage having multiple contact pads disposed in a row in accordance with a predetermined sequence, which are allocated to different connection types and having bonding wire connections that electrically connect at least some of the contact pads of the first contact assemblage to contact pads of the second contact assemblage. To reduce the outlay in terms of adaptation to different predetermined connection type allocations, it is proposed that the number and sequence of the contact pads in the first contact assemblage that are allocated to the different connection types be configured so that for at least two differently predetermined sequences of the contact pads in the second contact assemblage that are allocated to the different connection types, each of the contact pads of the second contact assemblage is to be connected in crossover-free fashion, by way of the bonding wire connections, to a contact pad of the first contact assemblage allocated to the same connection type.

13 Claims, 3 Drawing Sheets

ELECTRICAL CONTACT DEVICE

FIELD OF THE INVENTION

The present invention relates to an electrical contact device. One such contact device is used, for example, in the pressure sensor described in German Patent Application No. DE 197 11 939 A1.

BACKGROUND INFORMATION

Contact devices of this kind are used, for example, in control units or sensors in order to connect a circuit part to a connector part. Conventional pressure sensors use as a circuit part, for example, a pressure measurement chip that is disposed in a housing and has a measurement bridge disposed on a pressure-sensitive diaphragm, which bridge is electrically connected to conductive traces of the pressure measurement chip. The conductive traces are conductively connected to three contact pads disposed on the circuit part in an edge region, which fields are allocated to, for example, three connection types—ground (GND), supply voltage ($V_{DD}$), and signal voltage ($V_{OUT}$)—and constitute a first contact assemblage. The connector part of the pressure sensor has contact elements that are equipped with three contact pads that are disposed in a row and face toward the circuit part, and are likewise allocated to the ground, supply voltage, and signal voltage connection types; these contact pads constitute a second contact assemblage. If the sequence in which the three contact pads of the first contact assemblage are disposed is, for example, $V_{DD}$-GND-$V_{OUT}$, the three contact pads of the first contact assemblage can then be connected in crossover-free fashion to the three contact pads of the second contact assemblage only if the disposition of the second contact pads is likewise $V_{DD}$-GND-$V_{OUT}$, i.e., if the sequence of the contact pads allocated to the different connection types is the same in both contact assemblages.

In automotive engineering in particular, however, pressure sensors must often be adapted to the connector assignments predetermined by the manufacturer. If the manufacturer defines the sequence of connection types differently by way of the connector assignment (e.g. $V_{OUT}$-$V_{DD}$-GND), then either a laborious reconfiguration of the connector part is necessary in order to enable a crossover-free bonding wire connection between the two contact assemblages, or else the sequence of contact pads of the first contact assemblage on the circuit part that are allocated to the connection types must be modified, which represents an even more considerable additional effort. Although a limited degree of relief can be had by keeping two types of circuit part in stock, the circuit layout of the second type and therefore also the sequence of the contact pads in the first contact assemblage being transposed relative to the first type (mirror-image chip method), even then not all combinations can be covered.

SUMMARY

An example contact device according to the present invention allows the first contact assemblage to be connected to the second contact assemblage by way of bonding wire connections, in crossover- and intersection-free fashion, without a great deal of additional manufacturing effort and irrespective of the connection-type assignment of the second contact assemblage predetermined by the manufacturer. Additional contact pads are provided for this purpose in the first contact assemblage, the number and sequence of the contact pads in the first contact assemblage allocated to the various connection types being constituted such that for at least two differently predetermined sequences of the contact pads in the second contact assemblage, each of the contact pads of the second contact assemblage is to be connected in crossover-free fashion, by way of bonding wire connections, to one of the contact pads of the first contact assemblage of the same connection type. "Connect in crossover-free fashion" means, in this context, e.g., that the vertical projections of the bonding wire connections do not cross over or intersect in the plane of the contact assemblages. The avoidance of crossed bonding wire connections improves the EMC (electromagnetic compatibility) properties of the contact device.

A particularly advantageous exemplary embodiment is one in which the number and sequence of the contact pads of the first contact assemblage are configured so that for all possible different sequences or permutations of the contact pads in the second contact assemblage, each of the contact pads of the second contact assemblage is to be connected in crossover-free fashion, by way of the bonding wire connections, to one of the contact pads of the first contact assemblage of the same connection type.

In an exemplary embodiment, the contact pads of the first contact assemblage are electrically contacted to an electronic circuit part, and the contact pads of the second contact assemblage to contact elements of a connector part. The outlay for electrical connection between the connector part and the circuit part is, advantageously, independent of the connector assignment stipulation, since the outlay does not depend on the predetermined sequence of the contact pads in the second contact assemblage. The example contact device according to the present invention eliminates complex reconfiguration of the layout of the contact pads on the circuit part.

BRIEF DESCRIPTION OF THE DRAWINGS

Exemplary embodiments of the present invention are depicted in the figures and explained in the description below.

DETAILED DESCRIPTION OF EXAMPLE EMBODIMENTS

Figure 1A:
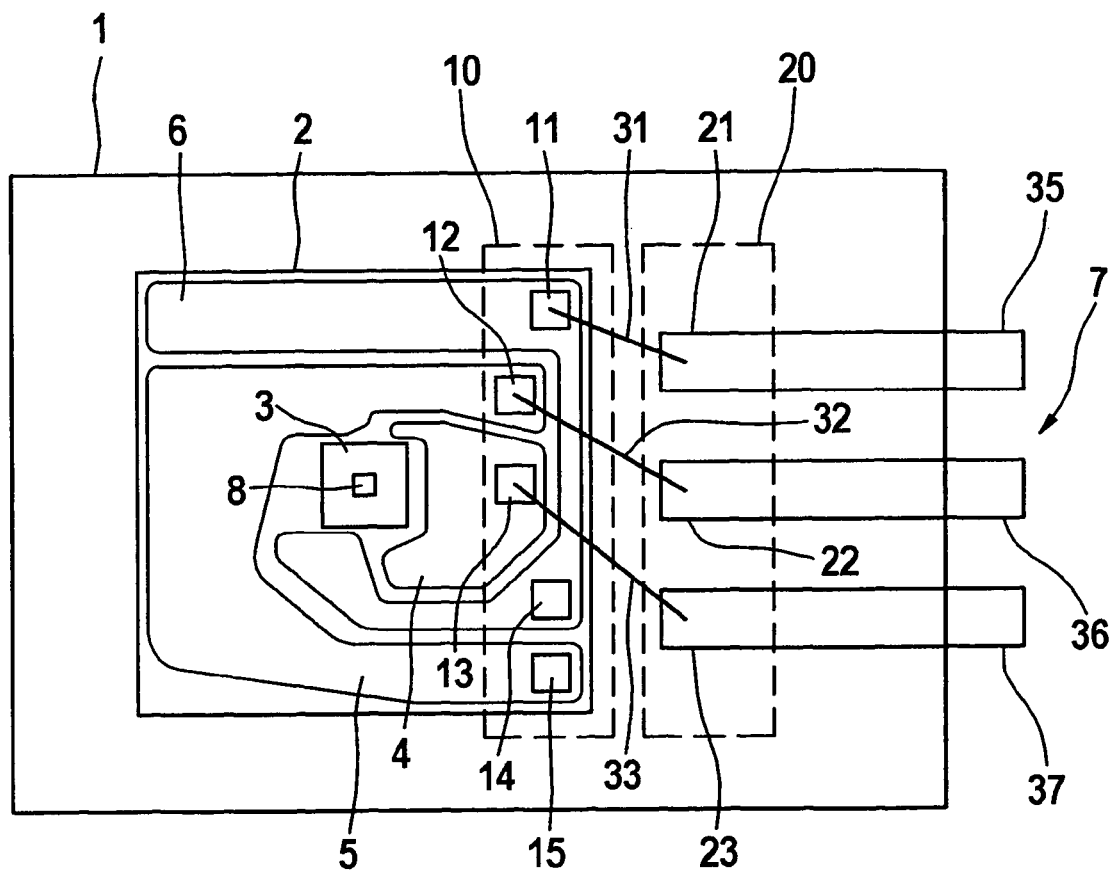
FIG. 1a shows a pressure sensor having a first exemplary embodiment of the contact device according to the present invention.

FIG. 1a shows a first exemplary embodiment of the contact device according to the present invention, which is disposed in a pressure sensor. The pressure sensor, depicted in highly simplified fashion, has a housing 1 in which a pressure measurement chip is disposed as circuit part 2. Circuit part 2 has a pressure-sensitive diaphragm 3 equipped with a measurement bridge 8. The diaphragm is electrically connected, in a manner not depicted, to conductive traces 4, 5, 6 on circuit part 2, the conductive traces being connected to contact pads 11, 12, 13, 14, and 15 in the edge region of the circuit part. Contact pads 11, 12, 13, 14, and 15, disposed in a row next to one another, constitute a first contact assemblage 10. The two contact pads 11 and 14 are connected to the same conductive trace 6 and therefore have the same connection type. Contact pads 12 and 15 are likewise connected to the same conductive trace and are allocated to the same connection type. The pressure sensor furthermore has a connector part 7 having contact elements 35, 36, and 37 guided out of housing 1. In the interior of the housing, contact elements 34, 35, 36 are equipped with contact pads 21, 22, 23 disposed in a row next to one another and forming a second contact assemblage 20 that is located opposite the contact pads of first contact assemblage 10, so that the contact pads of first contact assemblage 10 are connectable via bonding wire connections 31, 32, 33 to the contact pads of second contact assemblage 20. Bonding wire connections 31, 32, 33 are represented by the projections of the bonding wire connections in the plane of the contact assemblages. As is evident, the bonding wire connections are located next to one another in crossover-free fashion.

Figure 1B:
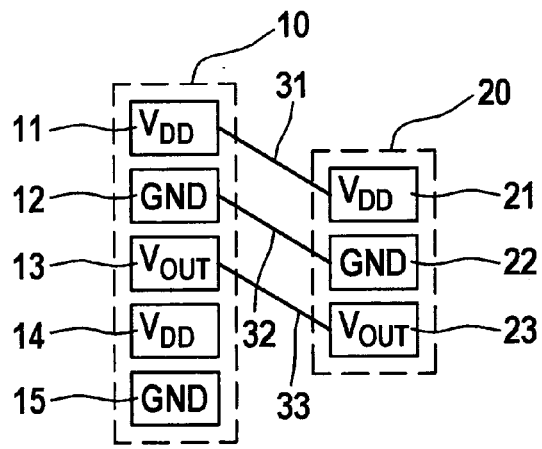
FIGS. 1b to 1g show the contact device of the first exemplary embodiment for differently predetermined connector assignments.

FIG. 1b shows the manner in which the contact pads depicted in FIG. 1a are allocated to different connection types. In first contact assemblage 10, for example, first contact pad 11 is allocated to the supply voltage $V_{DD}$ connection type, the adjacent second contact pad 12 is allocated to the ground GND connection type, and third contact pad 13 is allocated to the signal voltage $V_{OUT}$ connection type. Fourth contact pad 14 is once again allocated to supply voltage $V_{DD}$, and fifth contact pad 15 once again to ground GND. The second contact assemblage has three contact pads having a sequence of connection type allocations predetermined by the manufacture by way of the connector assignment. Thus in FIG. 1b, for example, contact pad 21 is allocated to supply voltage, contact pad 22 to ground, and contact pad 23 to signal voltage. In order to produce an electrical connection, contact pads of the two contact assemblages having the same connection type are then electrically connected via bonding wire connections 31, 32, and 33. As is shown in FIG. 1b, it is initially possible to produce a crossover-free bonding wire connection even without the additional contact pads 14 and 15 of the first contact assemblage: first bonding wire 31 connects first contact pad 11 of first contact assemblage 10 to first contact pad 21 of second contact assemblage 20, second bonding wire 32 connects second contact pad 12 of first contact assemblage 10 to second contact pad 22 of second contact assemblage 20, and third bonding wire 33 connects third contact pad 13 of first contact assemblage 10 to third contact pad 23 of second contact assemblage 20.

Figure 1C:
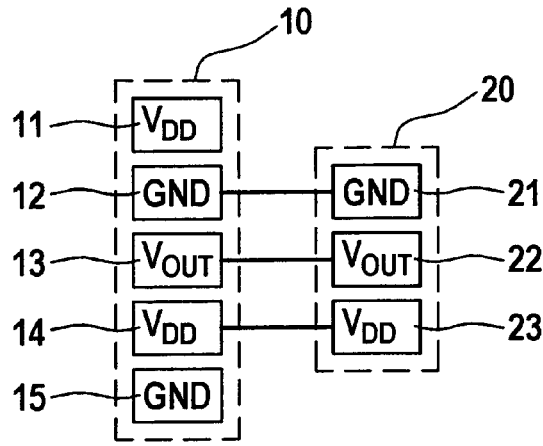
Figure 1D:
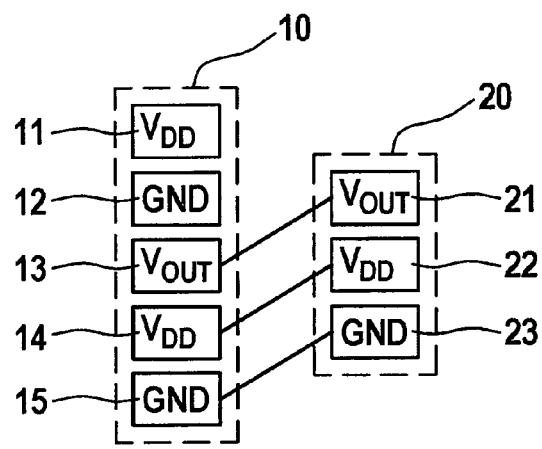
Figure 1E:
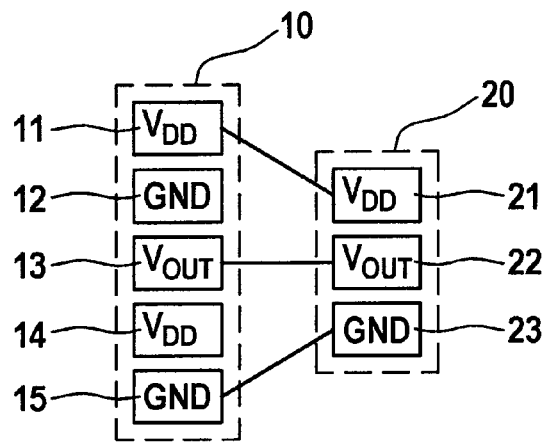

The purpose of the additional contact pads 14 and 15 in FIG. 1b that are not occupied by bonding wires becomes apparent in FIG. 1c, FIG. 1d, and FIG. 1e. In FIG. 1c, the manufacturer's connector assignment defines a different sequence of the contact pads allocated to the various connection types. Here, therefore, first contact pad 21 is allocated to ground GND, second contact pad 22 to signal voltage $V_{OUT}$, and third contact pad 23 to supply voltage $V_{DD}$. A crossover-free connection to contact pads 11, 12, and 13 of first contact assemblage 10 is therefore impossible, since contact pad 11 would need to be connected to contact pad 23. The additional fourth contact pad 14 of first contact assemblage 10, however, makes it is possible to produce all three bonding wire connections in crossover-free fashion. The same applies to the further possible sequences, shown in FIGS. 1d and 1e, of the contact pads of the second contact assemblage that are allocated to the three connection types.

Figure 1F:
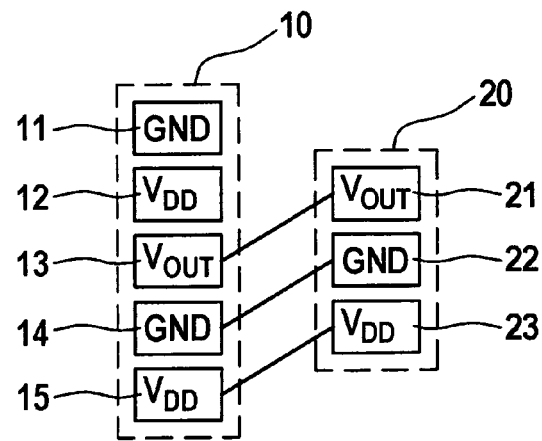
Figure 1G:
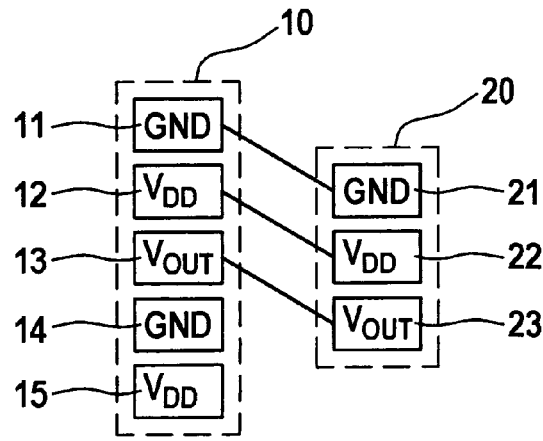

It follows from combinatorial theory that with three connection types there are a total of six possibilities or permutations for disposing the contact pads in the second contact assemblage. Of the six possibilities, the disposition depicted in FIGS. 1b to 1e of five contact pads in first contact assemblage 10 allows, for the four possible depicted allocations of connection types to the contact pads of second contact assemblage 20, an intersection-free bonding wire connection to be produced for each contact pad of the second contact assemblage. This is not the case only for two possible sequences of contact pads in the second contact assemblage. These are depicted in FIGS. 1f and 1g. If a mirror-image layout of circuit part 2 is then used here, in which the sequence of the connection type allocation is transposed in mirror-symmetrical fashion, it is thus possible, as shown in FIGS. 1f and 1g, also to produce all the bonding wire connections in crossover-free fashion for the two remaining possible sequences of contact pads in second contact assemblage 20.

In a second exemplary embodiment, only four contact pads 11, 12, 13, and 14 can be provided in first contact assemblage 10. Two possible sequences of the connection type disposition of the second contact assemblage can then be covered, and it is always the case that one contact pad of the first contact assemblage is not connected to the second contact assemblage. With the additional use of a mirror-image circuit part 2, a total of four possible sequences could then be encompassed. This exemplary embodiment is therefore less good than the first exemplary embodiment.

In a third exemplary embodiment, provision is made to provide the first contact assemblage with six contact pads 11, 12, 13, 14, 15, and 16, which are allocated to the connection types in the sequence $V_{DD}$-GND-$V_{OUT}$-$V_{DD}$-GND-$V_{OUT}$. It is thus possible to cover five of six possible sequences and, with the additional use of a mirror-image circuit part, of course all six possibilities as in the first exemplary embodiment.

Figure 2A:
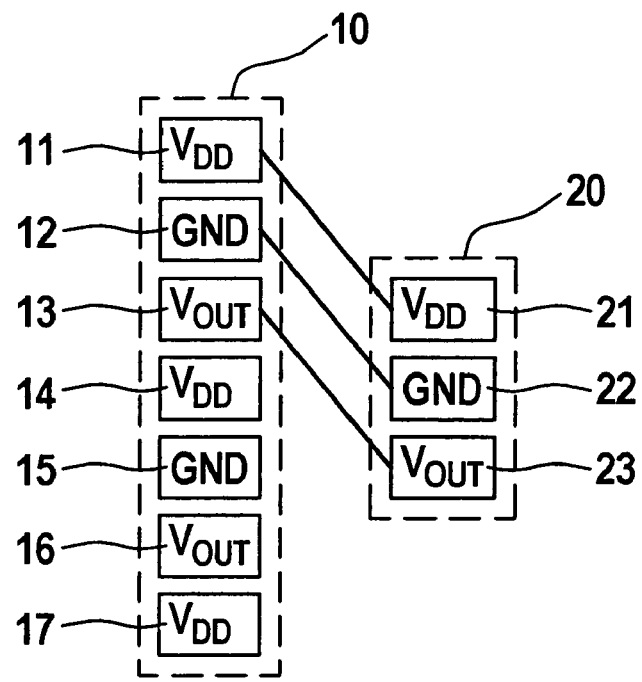
FIGS. 2a and 2b show a second exemplary embodiment of the contact device according to the present invention for two different connector assignments.
Figure 2B:
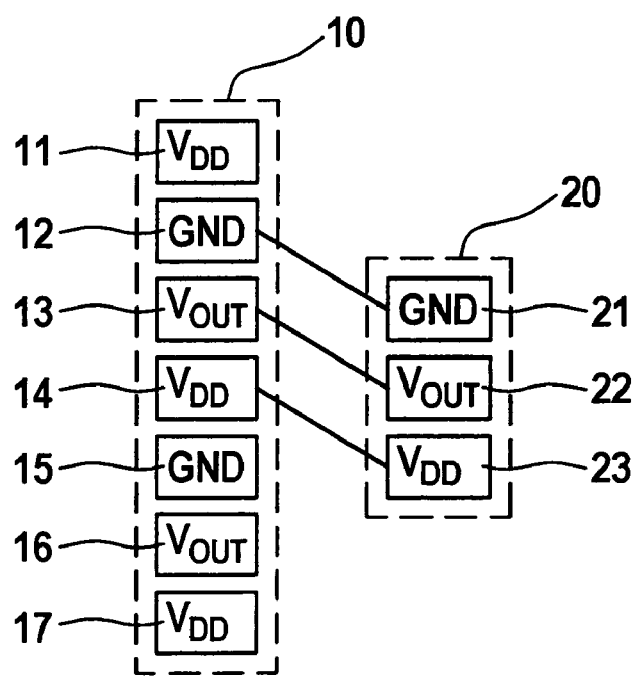

Another advantageous exemplary embodiment is depicted in FIGS. 2a and 2b. Here, seven contact pads 11, 12, 13, 14, 15, 16, and 17 are disposed in a row in the first contact assemblage and are allocated to the connection types in the sequence $V_{DD}$-GND-$V_{OUT}$-$V_{DD}$-GND-$V_{OUT}$-$V_{DD}$. All six possible sequences of contact pads 21, 22, 23 of second contact assemblage 20 allocated to the different connection types can thus be encompassed, only two of the six possibilities being depicted in FIGS. 2a and 2b. A mirror-image circuit part is no longer necessary here.

The four exemplary embodiments depicted have a second contact assemblage having three contact pads that are allocated to three connection types. The present invention is, however, by no means limited thereto, and can also be applied in the case of second contact assemblages having only two or more than three contact pads that are allocated to two or to more than three different connection types. The selection of connection types described in the exemplary embodiments is likewise merely exemplary. The connection types labeled $V_{DD}$, GND, $V_{OUT}$ can thus also be exchanged with one another, or other connection types can appear in their stead.

In addition to the contact pads of the first contact assemblage that are connected with the bonding wires and allocated to different connection types, further contact pads are additionally present which are allocated to those connection types, so that for different sequences of the contact pads in the second contact assemblage, each of the contact pads of the second contact assemblage can be connected in crossover-free fashion, by way of the bonding wire connections, to a contact pad of the first contact assemblage allocated to the same connection type.

The example contact device according to the present invention is not limited to use in pressure sensors, and can also be used in other sensors and in control units. Utilization is advantageous, in particular, wherever a contact coupling to different manufacturer connector assignments is necessary.

What is claimed is:
1. An electrical contact device, comprising:
   a first contact assemblage having multiple contact pads disposed in a row which are allocated to different connection types;

a second contact assemblage having at most three contact pads disposed in a row in accordance with a predetermined sequence, which are allocated to different connection types; and bonding wire connections adapted to electrically connect at least some of the contact pads of the first contact assemblage to contact pads of the second contact assemblage that are allocated to a same connection type;

wherein a number and sequence of the contact pads in the first contact assemblage that are allocated to the different connection types are configured so that for at least four differently predetermined sequences of the contact pads in the second contact assemblage that are allocated to the different connection types, each of the contact pads of the second contact assemblage is to be connected in crossover-free fashion, by way of the bonding wire connections, to a contact pad of the first contact assemblage allocated to the same connection type.

2. The electrical contact device as recited in claim 1, wherein the first contact assemblage has at least one contact pad that is not connected to the contact pads of the second contact assemblage.

3. The electrical contact device as recited in claim 1, wherein for all differently predetermined sequences of the contact pads in the second contact assemblage, each of the contact pads of the second contact assemblage is to be connected in crossover-free fashion, by way of the bonding wire connections, to one of the contact pads of the first contact assemblage of the same connection type.

4. The electrical contact device as recited in claim 1, wherein the contact pads of the first contact assemblage are electrically contacted to an electronic circuit part, and the contact pads of the second contact assemblage are electrically contacted to contact elements of a connector part.

5. The electrical contact device as recited in claim 4, wherein the second contact assemblage has three contact pads that are allocated to three different connection types and the first contact assemblage has three contact pads that are allocated to said three different connection types, and at least one further contact pad that is allocated to one of the three different contact types.

6. The electrical contact device as recited in claim 4, wherein the second contact assemblage has three contact pads that are allocated to three different connection types; and the first contact assemblage has three contact pads that are allocated to said three different connection types, and two further contact pads that are allocated to two of the three different connection types.

7. The electrical contact device as recited in claim 1, wherein the second contact assemblage has three contact pads that are allocated to three different connection types; and the first contact assemblage has three contact pads that are allocated to said three different connection types, and three further contact pads that are allocated to said three different connection types.

8. The electrical contact device as recited in claim 7, wherein the first contact assemblage has a seventh contact pad that is allocated to one of the three different connection types.

9. The electrical contact device as recited in claim 1, wherein those contact pads of the first contact assemblage that are allocated to the same connection type are at least in part connected to one another in electrically conductive fashion.

10. The electrical contact device as recited in claim 1, wherein the row of contact pads of the first contact assemblage is located at a distance opposite the row of contact pads of the second contact assemblage.

11. The electrical contact device as recited in claim 1, wherein the electrical contact device is included in a pressure sensor.

12. The electrical contact device as recited in claim 11, wherein:
the contact pads of the first contact assemblage are disposed on an electronic circuit part and are electrically connected there via conductive traces to a measurement bridge disposed on a diaphragm; and
the contact pads of the second contact assemblage are disposed, opposite the contact pads of the first contact assemblage, on contact elements of a connector part of the pressure sensor.

13. A pressure sensor, comprising:
an electrical contact device including:
a first contact assemblage having multiple contact pads disposed in a row which are allocated to different connection types;
a second contact assemblage having at most three contact pads disposed in a row in accordance with a predetermined sequence, which are allocated to different connection types; and
bonding wire connections adapted to electrically connect at least some of the contact pads of the first contact assemblage to contact pads of the second contact assemblage that are allocated to a same connection type;
wherein:
a number and sequence of the contact pads in the first contact assemblage that are allocated to the different connection types are configured so that for at least four differently predetermined sequences of the contact pads in the second contact assemblage that are allocated to the different connection types, each of the contact pads of the second contact assemblage is to be connected in crossover-free fashion, by way of the bonding wire connections, to a contact pad of the first contact assemblage allocated to the same connection type;
the contact pads of the first contact assemblage are disposed on an electronic circuit part and are electrically connected there via conductive traces to a measurement bridge disposed on a diaphragm; and
the contact pads of the second contact assemblage are disposed, opposite the contact pads of the first contact assemblage, on contact elements of a connector part of the pressure sensor.

* * * * *